United States Patent
Singh et al.

(10) Patent No.: US 11,837,460 B2
(45) Date of Patent: Dec. 5, 2023

(54) LATERAL BIPOLAR TRANSISTOR

(71) Applicant: GLOBALFOUNDRIES U.S. Inc., Malta, NY (US)

(72) Inventors: Jagar Singh, Clifton Park, NY (US); Alexander M. Derrickson, Saratoga Springs, NY (US); Alexander Martin, Greenfield Center, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 48 days.

(21) Appl. No.: 17/550,835

(22) Filed: Dec. 14, 2021

(65) Prior Publication Data

US 2023/0075949 A1    Mar. 9, 2023

Related U.S. Application Data

(60) Provisional application No. 63/240,466, filed on Sep. 3, 2021.

(51) Int. Cl.
| | | |
|---|---|---|
| *H01L 29/735* | (2006.01) | |
| *H01L 29/423* | (2006.01) | |
| *H01L 29/08* | (2006.01) | |
| *H01L 29/10* | (2006.01) | |
| *H01L 29/45* | (2006.01) | |

(52) U.S. Cl.
CPC ........ *H01L 29/735* (2013.01); *H01L 29/0808* (2013.01); *H01L 29/0821* (2013.01); *H01L 29/1008* (2013.01); *H01L 29/42304* (2013.01); *H01L 29/456* (2013.01)

(58) Field of Classification Search
CPC ............... H01L 29/6625; H01L 29/735; H01L 29/0808; H01L 29/0821; H01L 29/42304; H01L 29/456; H01L 21/8222; H01L 27/0259–0262; H01L 29/1004–1008; H01L 29/73; H01L 2924/1305
See application file for complete search history.

(56) References Cited

U.S. PATENT DOCUMENTS

| | | |
|---|---|---|
| 5,728,613 A | 3/1998 | Hsu et al. |
| 6,794,237 B2 | 9/2004 | Babcock et al. |
| 7,763,518 B2 | 7/2010 | Ho et al. |
| 9,318,585 B1* | 4/2016 | Cai ...................... H01L 29/737 |
| 9,748,369 B2 | 8/2017 | Liu |

(Continued)

OTHER PUBLICATIONS

Nii et al., "A novel lateral bipolar transistor with 67 GHz f/sub max/ on thin-film SOI for RF analog applications", IEEE Transactions on Electron Devices, Jul. 2000, vol. 47, Issue 7, Abstract.

(Continued)

*Primary Examiner* — Wasiul Haider
(74) *Attorney, Agent, or Firm* — Francois Pagette; Andrew M. Calderon; Calderon Safran & Cole PC (57) ABSTRACT

The present disclosure relates to semiconductor structures and, more particularly, to a lateral bipolar transistor and methods of manufacture. The structure includes: an extrinsic base region composed of semiconductor material; an emitter region on a first side of the extrinsic base region; a collector region on a second side of the extrinsic base region; and an extrinsic base contact wrapping around the semiconductor material of the extrinsic base region.

20 Claims, 7 Drawing Sheets

(56) References Cited

U.S. PATENT DOCUMENTS

| | | |
|---|---|---|
| 9,905,668 B2 | 2/2018 | Singh |
| 2011/0147840 A1 | 6/2011 | Cea et al. |
| 2013/0260526 A1* | 10/2013 | Cai .................. H01L 29/66242 |
| | | 257/E21.608 |
| 2021/0217880 A1* | 7/2021 | Burton .............. H01L 29/66272 |
| 2021/0273078 A1* | 9/2021 | Wu .................. H01L 29/66553 |

OTHER PUBLICATIONS

Hashemi et al., "Demonstration of Symmetric Lateral NPN Transistors on SOI Featuring Epitaxially Grown Emitter/Collector Regions," IEEE Journal of Electron Device Society, Dec. 11, 2017, vol. 6, 6 pages.

* cited by examiner

LATERAL BIPOLAR TRANSISTOR

BACKGROUND

The present disclosure relates to semiconductor structures and, more particularly, to a lateral bipolar transistor and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base region comprising semiconductor material; an emitter region on a first side of the extrinsic base region; a collector region on a second side of the extrinsic base region; and an extrinsic base contact wrapping around the semiconductor material of the extrinsic base region.

In an aspect of the disclosure, a structure comprises: a raised extrinsic base region comprising semiconductor material; a raised emitter region comprising an epitaxial semiconductor material on a first side of the extrinsic base region; a raised collector region comprising the epitaxial semiconductor material on a second side of the raised extrinsic base region; a dual sidewall spacer surrounding the semiconductor material of the raised extrinsic base region; and a wraparound contact wrapping around the raised emitter region and the raised collector region and contacting an outer sidewall spacer of the dual sidewall spacer.

In an aspect of the disclosure, a method comprises: forming an extrinsic base region comprising semiconductor material; forming an emitter region on a first side of the extrinsic base region; forming a collector region on a second side of the extrinsic base region; and forming an extrinsic base contact wrapping around the semiconductor material of the extrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a lateral bipolar transistor and methods of manufacture. More specifically, the present disclosure relates to a lateral bipolar transistor with a low base resistance using a wraparound contact. Advantageously, the lateral bipolar transistor provides for high voltage RF device applications (e.g., low noise amplifiers and power amplifiers), with a narrow base width (e.g., less than 20 nm). The lateral bipolar transistor may be used for applications in the millimeter waveband, e.g., 28 Gigahertz and higher; although other applications are also contemplated herein.

In embodiments, the lateral bipolar transistor may be either an NPN or PNP which comprises a wraparound base contact over an extrinsic region and shallow trench isolation structures. In further embodiments, the wraparound base contact may be over the emitter region and the collector region, and extends onto the shallow trench isolation structures. In this way, a contact may be provided for the extrinsic base region, the emitter region, and the collector region. Moreover, in embodiments, the lateral bipolar transistor comprises a narrow base width, e.g., less than 20 nm and preferably between 6 nm and 10 nm width, to meet Ft criteria. The wraparound contact may also be provided in a planar environment, with a side contact over the emitter region and collector region to address current crowding and self-heating (emitter resistance (Re) and collector resistance (Rc).

The lateral bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor of the present disclosure have been adopted from integrated circuit (IC) technology. For example, the structures are built on wafers and are realized in films of material patterned by photolithographic processes on the top of a wafer. In particular, the fabrication of the lateral bipolar transistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
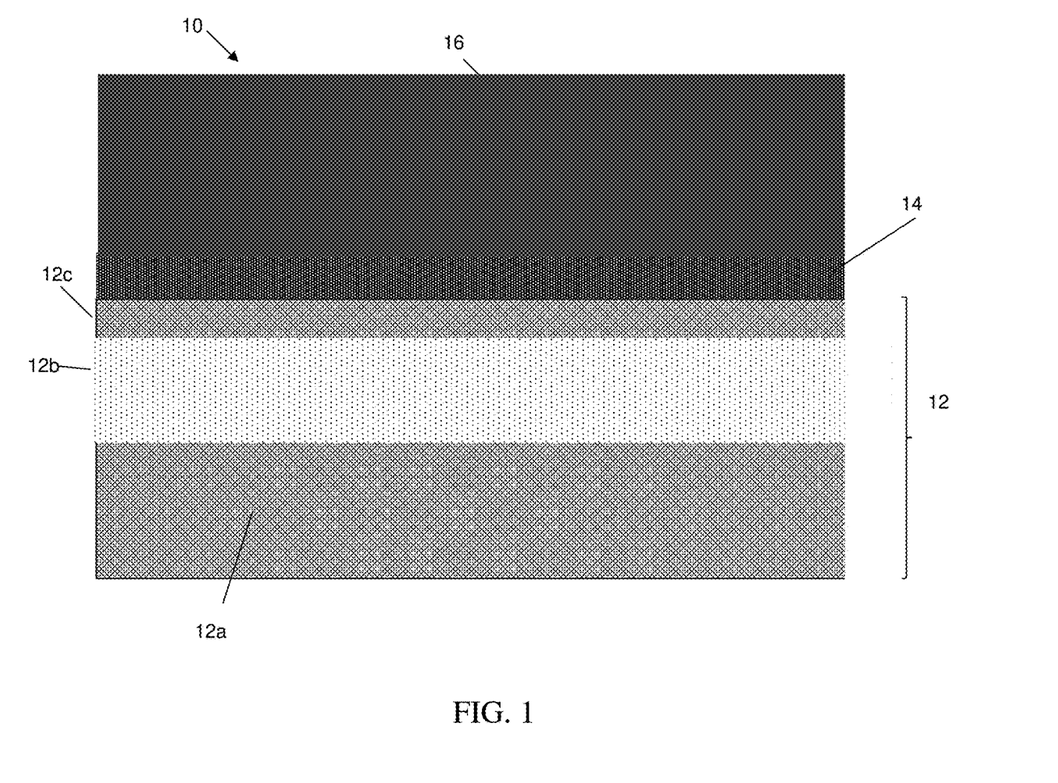
FIG. 1 shows a substrate and respective fabrication processes in accordance with aspects of the present disclosure.

FIG. 1 shows a substrate and respective fabrication processes. In particular, the structure 10 of FIG. 1 includes a semiconductor substrate 12 which may be a semiconductor-on-insulator (SOI) substrate. More specifically, the substrate 12 includes a semiconductor handle wafer 12a, an insulator layer 12b and a semiconductor layer 12c on the insulator layer 12b. In the SOI implementation, the semiconductor handle wafer 12a provides mechanical support to the insulator layer 12b and the semiconductor layer 12c. The semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. Moreover, the semiconductor handle wafer 12a may be a p-substrate and the semiconductor layer 12c may thinned to about 10 nm, for example. In further embodiments, the semiconductor handle wafer 12a may include high resistivity wells as is known in the art.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In another embodiment, the insulator layer 12b may be formed using a thermal growth process, such as thermal oxidation, to convert a surface portion of the semiconductor handle wafer 12a to an oxide material. In yet another embodiment, the insulator layer 12b may be formed by implanting oxygen atoms into a bulk semiconductor substrate and thereafter annealing the structure.

Still referring to FIG. 1, a semiconductor material 14 may be formed on the semiconductor layer 12c. In embodiments, the semiconductor material 14 may be SiGe material. In more specific embodiments, the semiconductor material 14 may be SiGe doped with C. The semiconductor material 14 may be epitaxially grown on the semiconductor layer 12c, with in-situ carbon doping. The semiconductor material 14 may be 2 nm in depth; although other dimensions are contemplated herein depending on the desired device performance.

An additional semiconductor material 16 may be formed on the semiconductor material 14. The additional semiconductor material 16 may be a P+Si material, which is epitaxially grown on the semiconductor material 14. The p-type doping may be boron, as an example. The additional semiconductor material 16 may have a depth of about 6 nm; although other dimensions are contemplated herein depending on the desired device performance.

Figure 2:
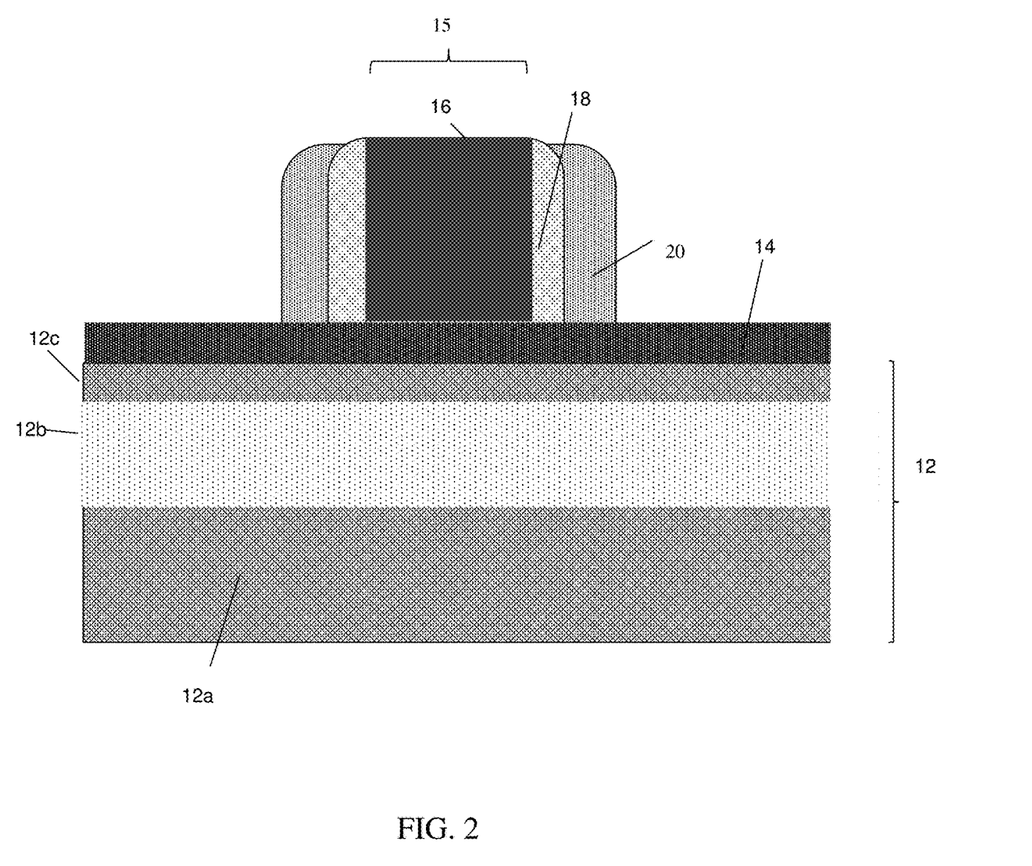
FIG. 2 shows sidewall spacers (e.g., dual sidewall spacers) on a sidewall surface of an extrinsic base region, amongst other features, and respective fabrication processes.

FIG. 2 shows a patterning of the semiconductor material 16 into an extrinsic base region 15 (with the semiconductor material 14 acting as an intrinsic base region). The patterning of the semiconductor material 16 may be conventional lithography and etching processes known to those of skill in the art. For example, a resist formed over the semiconductor material 16 is exposed to energy (light) to form a pattern (opening). An etching process with a selective chemistry, e.g., reactive ion etching (RIE), will be used to form a pattern, e.g., extrinsic base region 15 comprising the semiconductor material 16. Following the etching process, the resist may be removed by a conventional oxygen ashing process or other known stripants. The patterning of the extrinsic base region 15 may increase the surface area of the semiconductor material 16 and side contact to increase heat dissipation, e.g., take away heat.

FIG. 2 shows sidewall spacers 18, 20 (e.g., dual sidewall spacers) formed on a sidewall surface of the extrinsic base region 15, e.g., patterned semiconductor material 16. In embodiments, the sidewall spacers 18, 20 comprise low-k insulator materials with different etch selectivity, with the inner sidewall spacer 18 having a same etch selectivity as a subsequently formed shallow trench isolation structure. For example, the sidewall spacer 18 may comprise an oxide material and the outer sidewall spacer 20 may comprise a nitride material. The sidewalls spacers 18, 20 may be formed by a conventional deposition process, e.g., CVD, followed by anisotropic etching processes to remove any material from horizontal surfaces of the structure.

Figure 3:
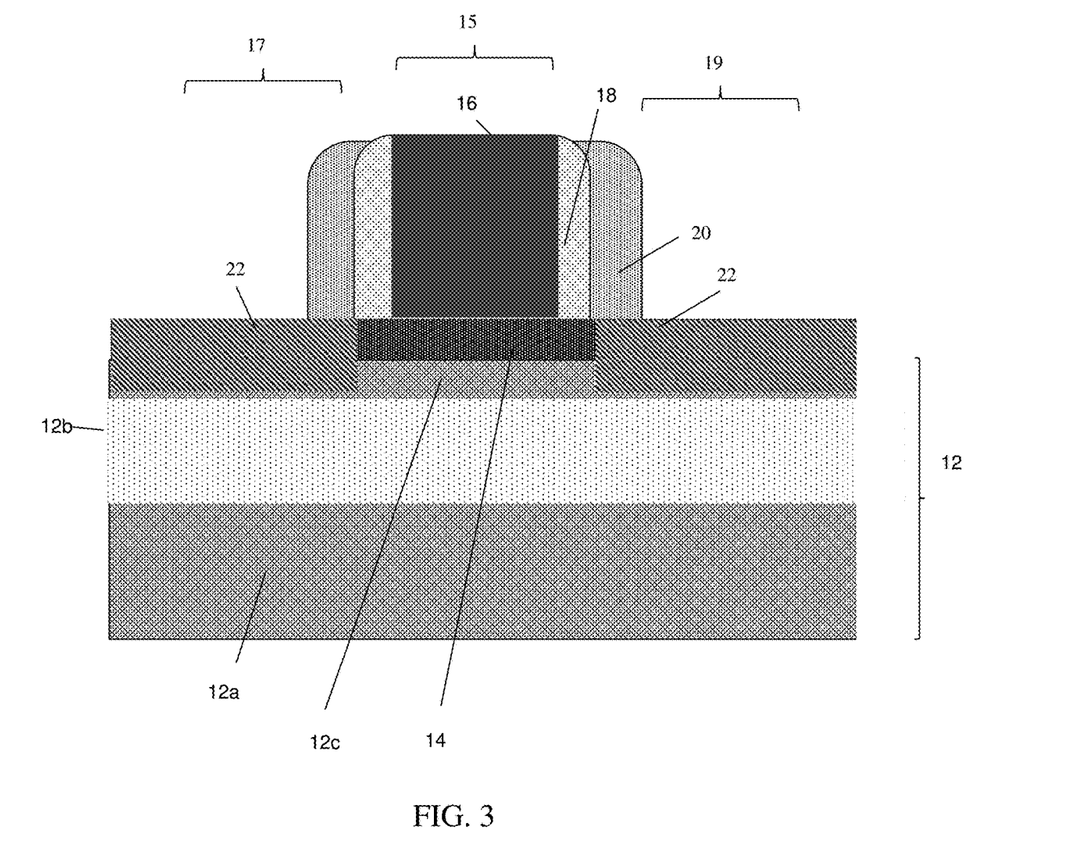
FIG. 3 shows an emitter region and a collector region on opposing sides of the extrinsic base region, amongst other features, and respective fabrication processes.

FIG. 3 shows an emitter region 17 and a collector region 19 on opposing sides of the extrinsic base region 15. In embodiments, the emitter region 17 and the collector region 19 may be formed by an emitter and collector etching process which opens a trench into the semiconductor material 14 and semiconductor layer 12c, followed by an epitaxial growth process. In embodiments, the emitter and collector etching process may be a conventional lithography process and etching process as already described herein such that no further explanation is required for a complete understanding of the present disclosure. In embodiments, the etching process forms a trench that extends under the outer sidewall spacer 20.

Following the etching process, a semiconductor material 22 may be epitaxially grown in the trench to form a collector region 19 and an emitter region 17 that wraps around the extrinsic base region 15. In embodiments, the semiconductor material 22 may be epitaxially grown Si material which extends underneath the outer sidewall spacer 20. In further embodiments, the epitaxial Si material may be N+ doped material, e.g., using arsenic or phosphorous. The N+ doping may occur in-situ during the epitaxial growth process. This configuration may lower the resistance of both the emitter region 17 (e.g., lower Re) and the collector region 19 (e.g., lower Rc), while also reducing heat.

As an alternative embodiment, the emitter region 17 and the collector region 19 may be formed by conventional ion implantation processes known to those of skill in the art. For example, an N-well implant region 22 may be formed using n-type dopants implanted within the semiconductor layer 12c and semiconductor material 14. The n-type dopants may be, e.g., Arsenic (As), Phosphorus (P) and Sb, among other suitable examples. In embodiments, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas, e.g., extrinsic base region 15, against receiving a dose of the implanted ions.

Figure 4:
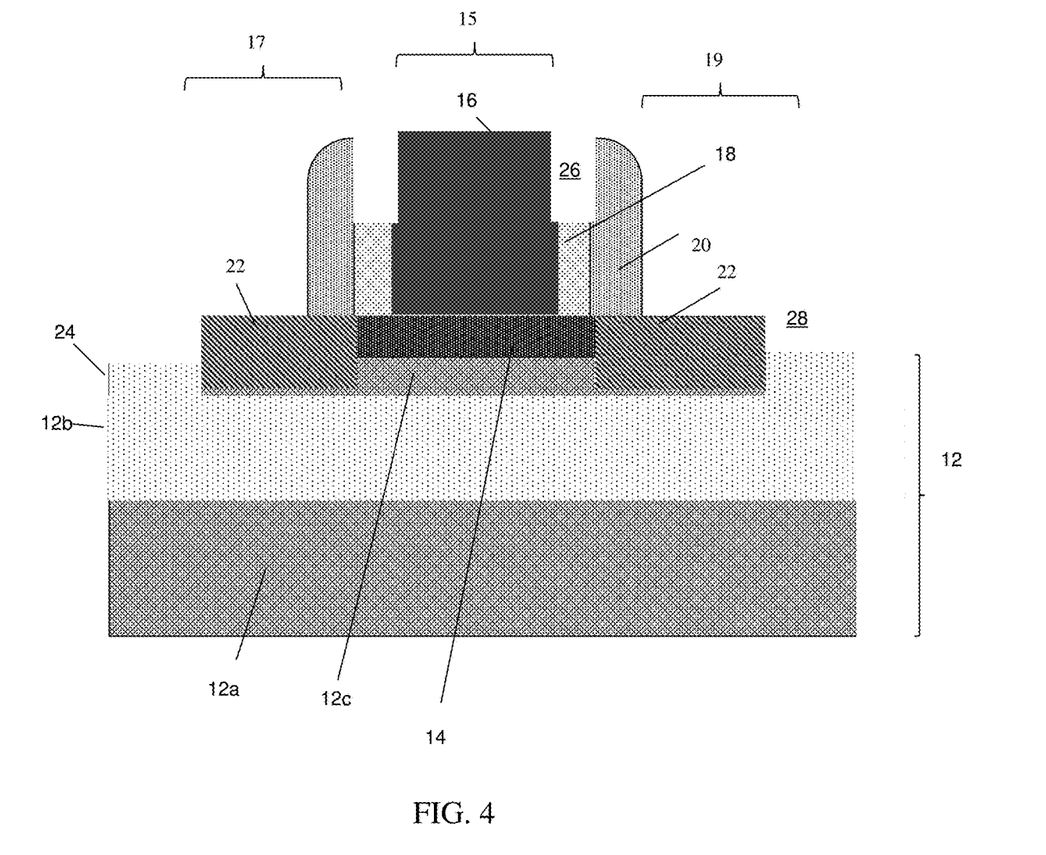
FIG. 4 shows recessed shallow trench isolation structures and a recessed portion of the dual sidewall spacers, amongst other features, and respective fabrication processes.

FIG. 4 shows shallow trench isolation structures 24 formed within the semiconductor layer 12c and semiconductor material 14. In embodiments, the shallow trench isolation structures 24 may be used to isolate the lateral bipolar transistor from other devices, as an example. The shallow trench isolation structures 24 can be formed by conventional lithography, etching and deposition methods known to those of skill in the art. For example, a resist formed over the semiconductor material 14 is exposed to energy (light) to form a pattern (opening). An etching process with a selective chemistry, e.g., RIE, will be used to form one or more trenches in the semiconductor layer 12c and semiconductor material 14 through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor material 14 may be removed by conventional chemical mechanical polishing (CMP) processes.

Still referring to FIG. 4, the shallow trench isolation structures 24 and the sidewalls spacer 18 may both be recessed using a conventional timed wet etching process of, e.g., oxide material. In this way, a trench or recessed portion 26 may be formed between the sidewall spacer 20 and the semiconductor material 16, e.g., extrinsic base region 15, which effectively increases a contact surface area of the semiconductor material 16. Also, a recessed portion 28 may be formed over the shallow trench isolation structures 24 to effectively increase a contact surface area of the semiconductor material 22 of the emitter region 17 and the collector region 19. As should be understood by those of skill in the art, the increase in surface area will minimize resistance of the regions 15, 17, 19. In addition, the recessed portion 26 will effectively form a raised emitter region and a raised collector region; although such can also be accomplished with an overgrowth of the semiconductor material 22, in addition to or without the recess formation.

Figure 5:
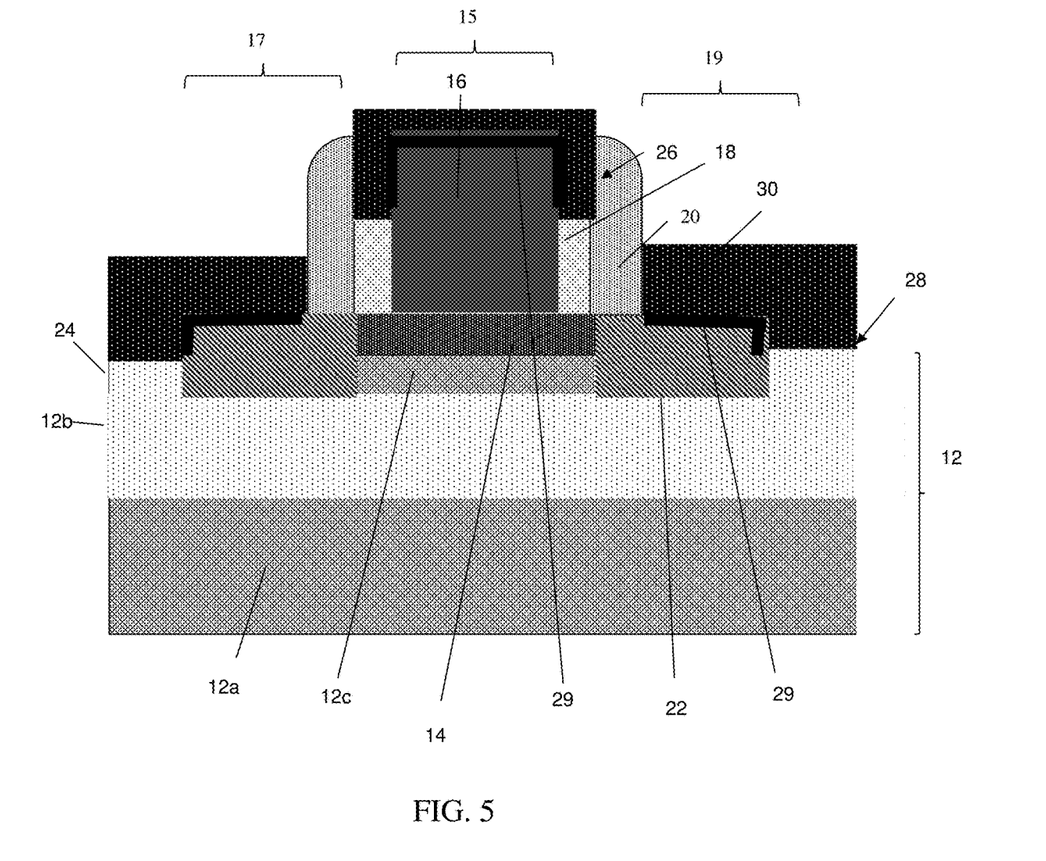
FIG. 5 shows a silicide and conductive material deposited within the extrinsic base region, the emitter region, and the collector region, amongst other features, and respective fabrication processes.

In FIG. 5, a conductive material 30 is deposited within the extrinsic base region 15, the emitter region 17 and the collector region 19. Prior to the deposition of the conductive material, a silicide 29 (e.g., NiSi) may be formed on the exposed semiconductor material 16 of the extrinsic base region 15 (including the exposed sidewalls of the semiconductor material 16 within the recessed portion 26) and the N+ semiconductor material 22 of the emitter region 17 and the collector region 19 (e.g., exposed top and side surfaces).

As should be understood by those of skill in the art, the silicide process begins with deposition of a thin transition metal layer, e.g., nickel, cobalt or titanium, over the semiconductor materials 16, 22. After deposition of the material, the structure is heated allowing the transition metal to react with exposed semiconductor material (e.g., source, drain, gate contact region) forming a low-resistance transition metal silicide, e.g., TiSi. In this way, the silicide 29 will wrap around the extrinsic base region 15, the emitter region 17 and the collector region 19. Following the reaction, any remaining transition metal is removed by chemical etching, leaving silicide contacts 29.

The conductive material 30 may be deposited on the silicide 29 within the trench 26 and over the semiconductor material 18. More specifically, in embodiments, the conductive material 30 may be within the upper recessed portion 28 directly contacting sidewalls of the semiconductor material 16 of the extrinsic base region 15 and an inner surface of the outer sidewall spacer 20, in addition to a top surface of the semiconductor material 16 of the extrinsic base region 15. In this way, the conductive material 30 may be wrapped around an increased surface area of the extrinsic base region 15, e.g., exposed top and side surfaces of the semiconductor material 16.

Similarly, the conductive material 30 may be deposited within the recessed portion 28 and over an increased surface area of the N+ semiconductor material 22 of the emitter region 17 and the collector region 19, e.g., exposed top surface and outer side surface of the semiconductor material 22. In embodiments, the conductive material 30 directly contacts the outer sidewall spacer 20 of the extrinsic base region 15. In this way, the conductive material 30 may be wrapped around the exposed the semiconductor material 22 of the emitter region 17 and the collector region 19, in addition to be around the extrinsic base region 15, e.g., semiconductor material 16, which is separated by the outer sidewall spacer 20. In embodiments, the conductive material 30 may be tungsten, as an example.

Figure 6:
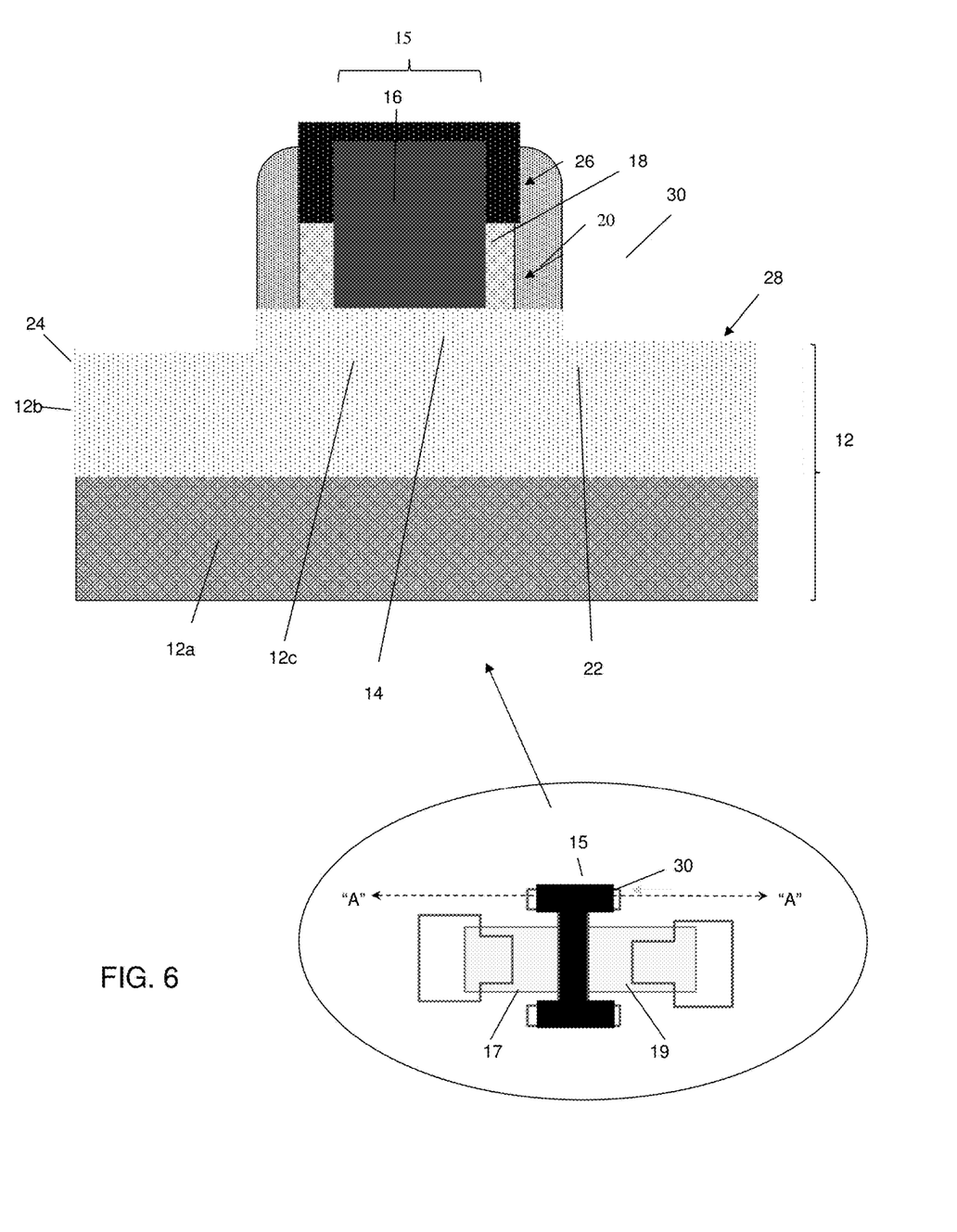
FIG. 6 shows a cross-sectional view of the structure of FIG. 5, along line "A" shown in the inset, amongst other features, and respective fabrication processes.

FIG. 6 shows a cross-sectional view of the structure of FIG. 5, along line "A" shown in the inset of FIG. 6. As shown in this cross-sectional view, the conductive material 30 wraps around the extrinsic base region 15. In contrast, the conductive material is not provided on the sides of the extrinsic base region within the recessed portions 26 of the shallow trench isolation structures. This is due to the fact that the cross section of FIG. 6 is not taken along the emitter region 17 or collector region 19. It is further shown that the extrinsic base region 15 may be "H" shaped, although other configurations are contemplated herein.

Figure 7:
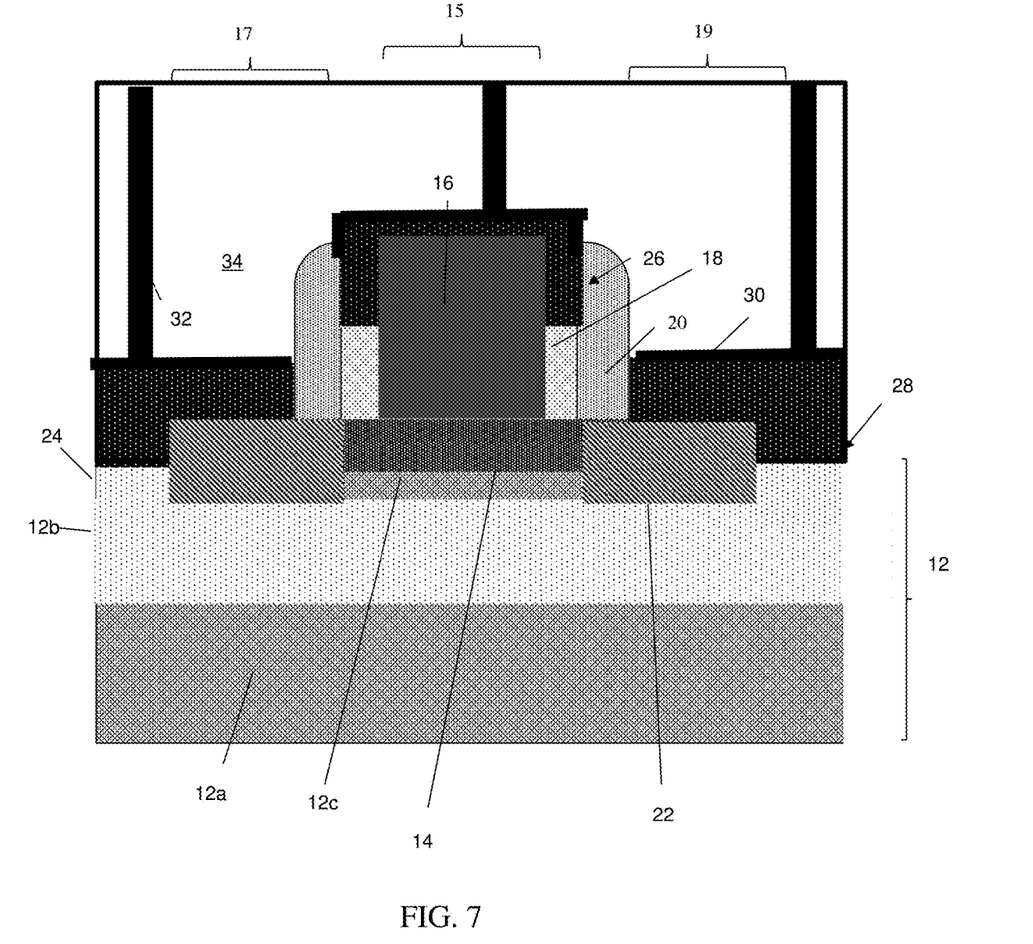
FIG. 7 shows contacts to the conductive material in the extrinsic base region, the emitter region, the collector region, amongst other features, and respective fabrication processes.

Referring to FIG. 7, contacts 32 are provided to the conductive material 30 in the extrinsic base region 15, the emitter region 17, the collector region 19. Prior to forming the contacts 32. The contacts 32 may be tungsten or aluminum formed by conventional lithography, etching and deposition processes. For example, an interlevel dielectric material or stack of materials 34 may be deposited over the structure, followed by via formation to expose the underlying conductive material 30 in each of the regions 15, 17, 19. The vias may be formed conventional lithography and etching processes. A conductive material, e.g., tungsten or aluminum, may be deposited within the vias to form the contacts 32. Any residual material on the interlevel dielectric material 34 may be removed by a CMP process.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
an extrinsic base region comprising semiconductor material;

an emitter region on a first side of the extrinsic base region;
a collector region on a second side of the extrinsic base region; and
an extrinsic base contact wrapping around the semiconductor material of the extrinsic base region; and
a sidewall spacer surrounding the extrinsic base region, wherein the sidewall spacer comprises an upper recessed portion.

2. The structure of claim 1, wherein the extrinsic base contact surrounds side surfaces and a top surface of the semiconductor material of the extrinsic base region.

3. The structure of claim 2, wherein the extrinsic base contact comprises a silicide material and a conductive material.

4. The structure of claim 3, wherein the silicide material comprises NiSi and the conductive material comprises tungsten.

5. The structure of claim 3, wherein the sidewall spacer comprises a dual sidewall spacer surrounding the extrinsic base region, wherein an inner sidewall spacer of the dual sidewall spacer comprises the upper recessed portion.

6. The structure of claim 5, wherein the extrinsic base contact is within the upper recessed portion directly contacting sidewalls of the semiconductor material of the extrinsic base region and an inner surface of an outer sidewall spacer of the dual sidewall spacer.

7. The structure of claim 2, wherein the emitter region comprises a raised emitter region and the collector region comprises a raised collector region, each of which comprise an epitaxial semiconductor material.

8. The structure of claim 7, further comprising a dual sidewall spacer surrounding the extrinsic base region, the raised emitter region and the raised collector region being under an outer sidewall spacer of the dual sidewall spacer and adjacent to recessed shallow trench isolation structures.

9. The structure of claim 8, further comprising an emitter contact and a collector contact on the epitaxial semiconductor material of the raised emitter region and the raised collector region, respectively.

10. The structure of claim 9, wherein the emitter contact and the collector contact wrap around the epitaxial semiconductor material of the raised emitter region and the raised collector region, respectively.

11. The structure of claim 10, wherein the emitter contact and the collector contact wrap around the extrinsic base region and contact the outer sidewall spacer.

12. The structure of claim 8, wherein the emitter contact and the collector contact are over the recessed shallow trench isolation structures.

13. A structure comprising:
a raised extrinsic base region comprising semiconductor material;
a raised emitter region comprising an epitaxial semiconductor material on a first side of the extrinsic base region;
a raised collector region comprising the epitaxial semiconductor material on a second side of the raised extrinsic base region;
a dual sidewall spacer surrounding the semiconductor material of the raised extrinsic base region, wherein the dual sidewall spacer comprises a recessed inner sidewall spacer and an outer sidewall spacer, an extrinsic base contact being over the recessed inner sidewall spacer; and
a wraparound contact wrapping around the raised emitter region and the raised collector region and contacting the outer sidewall spacer of the dual sidewall spacer.

14. The structure of claim 13, wherein the wraparound contact surrounds and directly contacts an outer side surface and a top surface of the epitaxial semiconductor material of the raised collector region and the raised emitter region.

15. The structure of claim 14, further comprising recessed shallow trench isolation structures adjacent to the raised collector region and the raised emitter region, and the wraparound contact being over the recessed shallow trench isolation structures.

16. The structure of claim 13, wherein the extrinsic base contact wraps around the semiconductor material of the raised extrinsic base region.

17. The structure of claim 13, wherein the extrinsic base contact contacts an inner wall of the outer sidewall spacer and sidewalls of the semiconductor material of the raised extrinsic base region.

18. The structure of claim 17, wherein the upper recessed portion is an inner portion facing an outer wall of the extrinsic base region and which provides a space for the extrinsic base contact to be in contact with the extrinsic base region on the outer wall of the extrinsic base region.

19. The structure of claim 17, wherein the wraparound contact and the extrinsic base contact comprise silicide and conductive material.

20. A method comprising:
forming an extrinsic base region comprising semiconductor material;
forming an emitter region on a first side of the extrinsic base region;
forming a collector region on a second side of the extrinsic base region;
forming an extrinsic base contact wrapping around the semiconductor material of the extrinsic base region; and
forming a dual sidewall spacer surrounding the extrinsic base region, wherein an inner sidewall spacer of the dual sidewall spacer comprises an upper recessed portion.

* * * * *